US008258614B2

(12) United States Patent
Camacho et al.

(10) Patent No.: US 8,258,614 B2
(45) Date of Patent: Sep. 4, 2012

(54) INTEGRATED CIRCUIT PACKAGE SYSTEM WITH PACKAGE INTEGRATION

(75) Inventors: Zigmund Ramirez Camacho, Singapore (SG); Jairus Legaspi Pisigan, Singapore (SG); Abelardo Jr. Hadap Advincula, Singapore (SG); Lionel Chien Hui Tay, Singapore (SG)

(73) Assignee: Stats Chippac Ltd., Singapore (SG)

( * ) Notice: Subject to any disclaimer, the term of this patent is extended or adjusted under 35 U.S.C. 154(b) by 502 days.

(21) Appl. No.: 11/938,371

(22) Filed: Nov. 12, 2007

(65) Prior Publication Data

US 2009/0121335 A1 May 14, 2009

(51) Int. Cl.
*H01L 23/06* (2006.01)

(52) U.S. Cl. . 257/684; 257/777; 257/778; 257/E21.499; 438/106; 438/109

(58) Field of Classification Search .................. 250/239; 257/E21.499, 668–778; 438/106–109; 361/761
See application file for complete search history.

(56) References Cited

U.S. PATENT DOCUMENTS 5,608,262 A * 3/1997 Degani et al. ................. 257/723
5,977,640 A * 11/1999 Bertin et al. .................. 257/777
6,154,370 A * 11/2000 Degani et al. ................. 361/761
6,239,484 B1 * 5/2001 Dore et al. ..................... 257/687
6,297,551 B1 * 10/2001 Dudderar et al. ............. 257/723
6,437,430 B2 * 8/2002 Yamada ......................... 257/668
6,693,362 B2 * 2/2004 Seyama et al. ................ 257/777
6,967,395 B1 11/2005 Glenn et al.
7,026,719 B2 * 4/2006 Wang ............................ 257/777
7,061,120 B2 6/2006 Shin et al.
7,075,177 B2 7/2006 Oka et al.
7,101,731 B2 9/2006 Karnezos
7,163,842 B2 1/2007 Karnezos
2002/0047214 A1 * 4/2002 Morinaga et al. ............. 257/778
2002/0096781 A1 * 7/2002 Toyosawa ..................... 257/777
2003/0127749 A1 * 7/2003 Lin et al. ....................... 257/778
2003/0211656 A1 11/2003 Uchida
2004/0106229 A1 * 6/2004 Jiang et al. .................... 438/106
2006/0249828 A1 11/2006 Hong
2006/0266938 A1 * 11/2006 Abela ........................... 250/239
2006/0267175 A1 * 11/2006 Lee .............................. 257/686
2008/0315406 A1 12/2008 Chung et al.

* cited by examiner

*Primary Examiner* — Jerome Jackson, Jr.
*Assistant Examiner* — Fang-Xing Jiang
(74) *Attorney, Agent, or Firm* — Ishimaru & Associates LLP; Mikio Ishimaru; Stanley M. Chang

(57) ABSTRACT

An integrated circuit package system comprising: providing a substrate having a cavity; sealing a package over the cavity of the substrate; and forming an encapsulant over the package and a portion of the substrate substantially preventing the encapsulant from forming in the cavity.

20 Claims, 9 Drawing Sheets

INTEGRATED CIRCUIT PACKAGE SYSTEM WITH PACKAGE INTEGRATION

CROSS-REFERENCE TO RELATED APPLICATION(S)

The present application contains subject matter related to co-pending U.S. patent application Ser. No. 11/767,820 filed Jun. 25, 2007, titled "INTEGRATED CIRCUIT PACKAGE SYSTEM WITH CAVITY SUBSTRATE". The related application is assigned to STATS ChipPAC Ltd.

TECHNICAL FIELD

The present invention relates generally to integrated circuit packages and more particularly to a system for integrated circuit packages with package in package.

BACKGROUND ART

Electronic products have become an integral part of our daily lives. Notably, many portable electronics with complex integrated circuits are not only common but also often utilized without the slightest thought about the underlying technology. Many products such as cell phones, portable computers, voice recorders, cars, planes, etc. include very sophisticated technology.

With virtually all functions and purposes for which we use these products, there continues to be demand for new features, speed, data, or portability. These demands continually drive the electronics industry to reduce the size, improve the utility, and increase the performance of the integrated circuit devices contained within these products to which we have become accustomed.

There has been constant pressure within the semiconductor industry to reduce dimensional footprints as well as increase quality, reliability, and performance fueled by consumer demands for smaller, higher quality computers and electronic devices that operate faster, with more information, and more reliably under broader operating conditions and environments.

The smaller and smaller integrated circuits are commonly assembled into integrated circuit packages for protection and interconnection to other integrated circuits, integrated circuit packages, printed circuit boards, or other subsystems. The development of integrated circuit packages requires not only compatibility with a wide range of integrated circuits but can also provide integration or combinations not available to a single integrated circuit device.

Many electronic products have taken advantage of including multiple integrated circuit devices or integrated circuit packages within a larger integrated circuit package. The larger integrated circuit package provides protection from operating conditions, intraconnection between components, and interconnection to a next level subsystem. Modular components can also reduce defects lowering overall costs of the integrated circuit package.

While stacking integrated circuits within integrated circuit packages has improved dimensional densities and footprints it has not been without problems. Integrated circuit and integrated circuit package component dimensions have been limited and restricted by manufacturing methods and equipment. Component features and performance are all too often compromised by the restrictive limits of the available space.

Attempts to provide additional space for multiple components have also suffered from poor connectivity between the integrated circuits and integrated circuit packages within the larger package. Attempting to alleviate limited and restricted connectivity has commonly resulted in increasing size and complexity.

Despite the advantages of recent developments in integrated circuit and integrated circuit package manufacturing, there is a continuing need for improving integrated circuit device and integrated circuit package connectivity and stacking to provide improved dimensional size of available space and as well as structural integrity, manufacturing yield, and product reliability.

Thus, a need still remains for an integrated circuit package system to provide improved die attach and dimensions for components. In view of the increasing demand for improved density of integrated circuits and particularly portable electronic products, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a substrate having a cavity; sealing a package over the cavity of the substrate; and forming an encapsulant over the package and a portion of the substrate substantially preventing the encapsulant from forming in the cavity.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
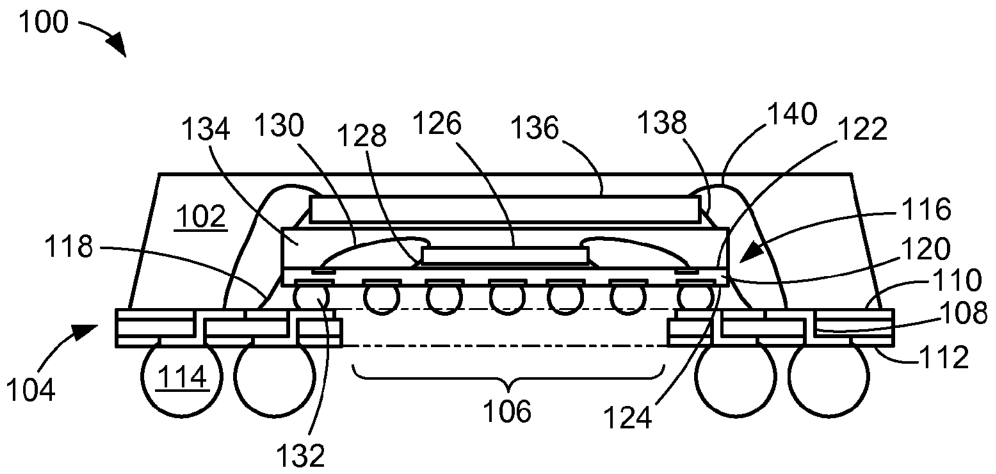
FIG. 1 is a cross-sectional view of an integrated circuit package system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Figure 2:
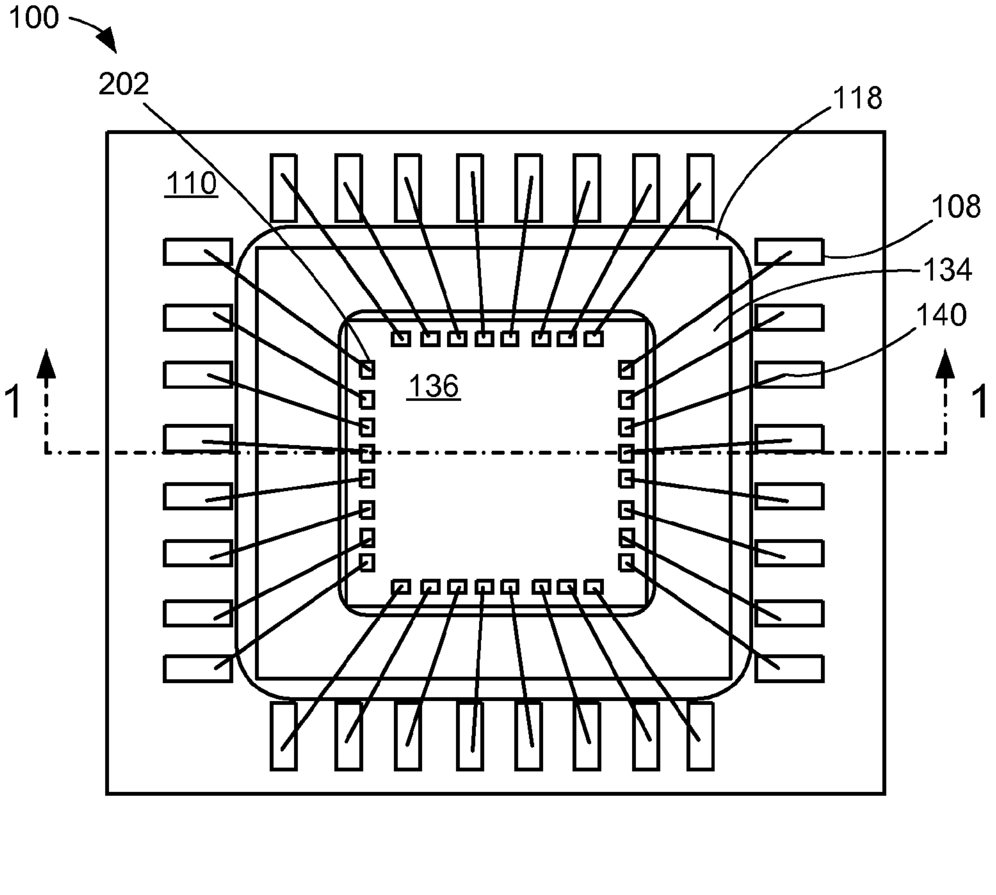
FIG. 2 is a top plan view of the integrated circuit package system in a die connect phase.

Referring now to FIG. 1, therein is shown a cross-sectional view of an integrated circuit package system 100 taken along line 1-1 of FIG. 2 in a first embodiment of the present invention. The integrated circuit package system 100 preferably includes a package encapsulant 102 such as a mold material over a package substrate 104 having a package substrate cavity 106. Package substrate conductors 108 such as metal, semiconductors, or combination thereof, can connect a package substrate first surface 110 and a package substrate second surface 112.

For illustrative purposes, the package substrate 104 is shown having the package substrate first surface 110 and the package substrate second surface 112 although it is understood that the package substrate 104 may include any number of layers. Further, for illustrative purposes the package substrate conductors 108 are shown having one contiguous material although it is understood that the package substrate conductors 108 may be formed of different materials or in multiple layers.

Package connectors 114 such as solder balls, exposed leads, lands, pins, or other connectors can be formed over the package substrate second surface 112. Components within the integrated circuit package system 100 can optionally be electrically connected through the package substrate conductors 108 to the package connectors 114. The package connectors 114 can provide electrical connectivity to a next level system such as another package, a printed circuit board, a subsystem, or another system.

A base package 116 such as an integrated circuit package or a known good unit (KGU) can be mounted over the package substrate first surface 110. A seal material 118 such as a mold seal material or a dam seal material can be formed with a material such as an under-fill material, a dam encapsulant epoxy material, or other material. The seal material 118 can provide a seal or barrier for forming the package encapsulant 102 over the base package 116 thereby preventing the package encapsulant 102 from bleeding out through the package substrate cavity 106. The package encaosulant 102 s only outside a periphery or the seal formed by the seal material 118.

The base package 116 can include a base substrate 120 having a base substrate first surface 122 and a base substrate second surface 124. A base integrated circuit 126 can be attached or mounted over the base substrate first surface 122. An base attach layer 128 such as an adhesive, a film, a fill, or other material can be formed over a non-active surface of the base integrated circuit 126 and the base substrate first surface 122 for adhesion, structural integrity, thermal isolation, or thermal conductivity.

Base die connectors 130 such as bond wires, planar connectors, tab connectors, tape connectors, or other connectors can electrically connect the base integrated circuit 126 to the base substrate first surface 122. The base substrate 120 can be electrically connected to the package substrate 104 by base package connectors 132. A base encapsulant 134 can be formed on a side opposite the base package connectors 132 to protect the base integrated circuit 126, the base die connectors 130, and a portion of the base substrate second surface 124. The base encapsulant 134 formed on the side opposite the base package connectors 132 provides the base package connectors 132 in the package substrate cavity 106 exposed.

A top integrated circuit 136 can be attached or mounted over the base package 116 with a top attach layer 138 such as an adhesive, a film, a fill, or other material. The top attach layer 138 can be applied over the base encapsulant 134 and a non-active surface of the top integrated circuit 136. Top die connectors 140 can electrically connect the top integrated circuit 136 to the package substrate conductors 108 of the package substrate 104.

The package encapsulant 102 can be formed over the top integrated circuit 136, the top die connectors 140, the base package 116, the seal material 118, and a portion of the package substrate first surface 110 including the package substrate conductors 108, leaving the base package connectors 132 ex)osed from the ackaize encapsulant)102 and partially in the package substrate cavity 106. The package encapsulant 102 can optionally provide a portion of the package substrate first surface 110 substantially exposed.

The integrated circuit package system 100 with the package substrate cavity 106 and the seal material 118 provides systematic interconnection and stacking of components such that original inputs and outputs of a known good unit are utilized as direct interface. Embodiments of the present invention minimize signal rerouting and efficiently utilize space resulting in densely packed functionality in a single package module.

It has been discovered that the package substrate cavity 106 with the seal material 118 forms a region providing a vertical spacing from about an outer extent of the base package connectors 132 to about an outer extent of the package connectors 114. The vertical spacing of the region formed by the package substrate cavity 106 with the seal material 118 eliminates restrictions or limitations based on extents of the package substrate 104.

Referring now to FIG. 2 therein is shown a top plan view of the integrated circuit package system 100 in a die connect phase. The integrated circuit package system 100 preferably includes the package substrate first surface 110, the package substrate conductors 108, the seal material 118, the base encapsulant 134, the top integrated circuit 136, and the top die connectors 140. The integrated circuit package system 100 can also include top die pads 202 such as bond pads or conductive pads on an active surface of the top integrated circuit 136.

The top die pads 202 provide electrical connectivity for the top integrated circuit 136 through the top die connectors 140 to the package substrate conductors 108. Electrical signals or electrical levels such as power, ground, or other level, can be transmitted from the top integrated circuit to the package substrate 104. The package substrate 104 can transmit electrical signals or electrical levels between the package substrate conductors 108, to the base integrated circuit 126 of the base package, or a next level system.

For illustrative purposes, the top die connectors 140 are shown connecting one of the top die pads 202 to one of the package substrate conductors 108 although it is understood that any number of the top die connectors 140 may be connected to one of the package substrate conductors 108. Further for illustrative purposes, all of the top die pads 202 and the package substrate conductors 108 are shown connected to the top die connectors 140 although it is understood that any number of the top die pads 202 or the package substrate conductors 108 may be unconnected.

Figure 3:
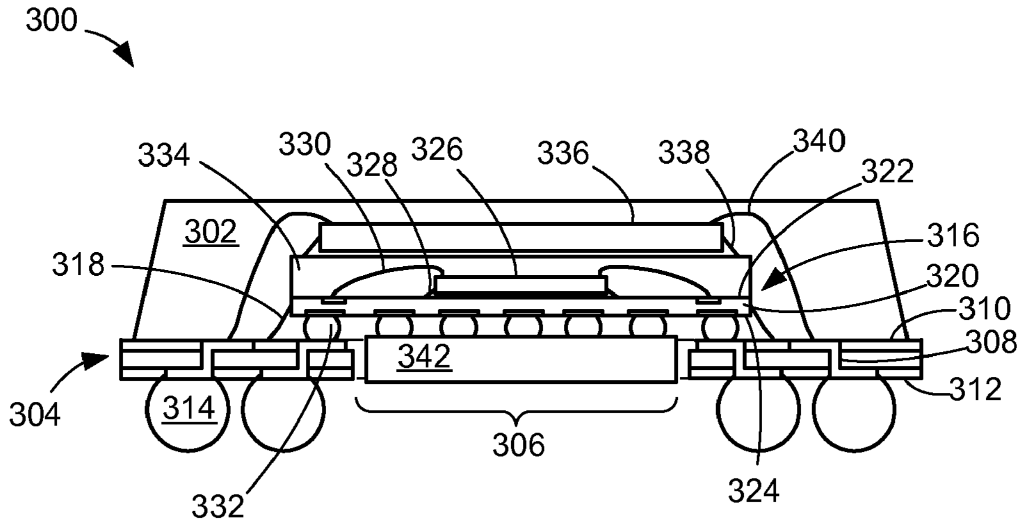
FIG. 3 is a cross-sectional view of an integrated circuit package system in a second embodiment of the present invention.

Referring now to FIG. 3, therein is shown a cross-sectional view of an integrated circuit package system 300 in a second embodiment of the present invention. The integrated circuit package system 300 preferably includes a package encapsulant 302 such as a mold material over a package substrate 304 having a package substrate cavity 306. Package substrate conductors 308 such as metal, semiconductors, or combination thereof, can connect a package substrate first surface 310 and a package substrate second surface 312.

Package connectors 314 such as solder balls, exposed leads, lands, pins, or other connectors can be formed over the package substrate second surface 312. Components within the integrated circuit package system 300 can optionally be electrically connected through the package substrate conductors 308 to the package connectors 314. The package connectors 314 can provide electrical connectivity to a next level system such as another package, a printed circuit board, a subsystem, or another system.

A base package 316 such as an integrated circuit package or an internal stacking module (ISM) can be mounted over the package substrate first surface 310. A seal material 318 such as a mold seal material or a dam seal material can be formed with a material such as an under-fill material, a dam encapsulant epoxy material, or other material. The seal material 318 can provide a seal or barrier for forming the package encapsulant 302 over the base package 316 thereby preventing the package encapsulant 302 from bleeding out through the package substrate cavity 306.

The base package 316 can include a base substrate 320 having a base substrate first surface 322 and a base substrate second surface 324. A base integrated circuit 326 can be attached or mounted over the base substrate first surface 322. An base attach layer 328 such as an adhesive, a film, a fill, or other material can be formed over a non-active surface of the base integrated circuit 326 and the base substrate first surface 322 for adhesion, structural integrity, thermal isolation, or thermal conductivity.

Base die connectors 330 such as bond wires, planar connectors, tab connectors, tape connectors, or other connectors can electrically connect the base integrated circuit 326 to the base substrate first surface 322. The base substrate 320 can be electrically connected to the package substrate 304 by base package connectors 332. A base encapsulant 334 can be formed on a side opposite the base package connectors 332 to protect the base integrated circuit 326, the base die connectors 330, and a portion of the base substrate second surface 324.

A top integrated circuit 336 can be attached or mounted over the base package 316 with a top attach layer 338 such as an adhesive, a film, a fill, or other material. The top attach layer 338 can be applied over the base encapsulant 334 and a non-active surface of the top integrated circuit 336. Top die connectors 340 can electrically connect the top integrated circuit 336 to the package substrate conductors 308 of the package substrate 304.

The package encapsulant 302 can be formed over the top integrated circuit 336, the top die connectors 340, the base package 316, the seal material 318, and a portion of the package substrate first surface 310 including the package substrate conductors 308. The package encapsulant 302 can optionally provide a portion of the package substrate first surface 310 substantially exposed.

The package substrate cavity 306 with the seal material 318 forms a region providing a vertical spacing from about an outer extent of the base package connectors 332 to about an outer extent of the package connectors 314. The vertical spacing of the region formed by the package substrate cavity 306 with the seal material 318 eliminates restrictions or limitations based on extents of the package substrate 304.

An electronic device 342 such as a flip chip die, ball grid array (BGA), land grid array (LGA), quad flat no-lead (QFN), quad flat package (QFP), bump chip carrier (BCC), wafer level chip scale package (WLCSP), or other device, can be attached or mounted partially within the package substrate cavity 306 over an outer extent of the base package 316. The electronic device 342 can be electrically connected to the base package connectors 332 and have an outer extent within the outer extent of the package connectors 314.

Figure 4:
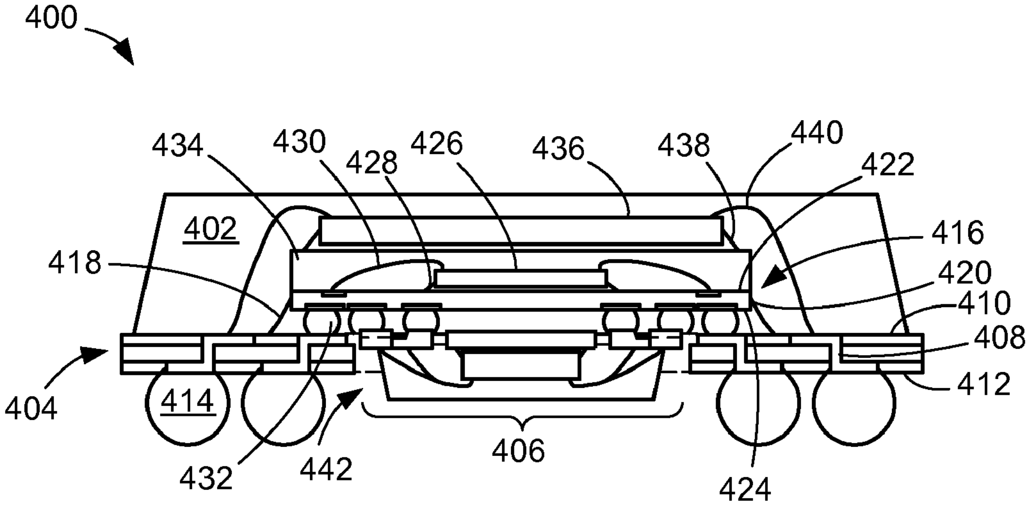
FIG. 4 is a cross-sectional view of an integrated circuit package system in a third embodiment of the present invention.

Referring now to FIG. 4, therein is shown a cross-sectional view of an integrated circuit package system 400 in a third embodiment of the present invention. The integrated circuit package system 400 preferably includes a package encapsulant 402 such as a mold material over a package substrate 404 having a package substrate cavity 406. Package substrate conductors 408 such as metal, semiconductors, or combination thereof, can connect a package substrate first surface 410 and a package substrate second surface 412.

Package connectors 414 such as solder balls, exposed leads, lands, pins, or other connectors can be formed over the package substrate second surface 412. Components within the integrated circuit package system 400 can optionally be electrically connected through the package substrate conductors 408 to the package connectors 414. The package connectors 414 can provide electrical connectivity to a next level system such as another package, a printed circuit board, a subsystem, or another system.

A base package 416 such as an integrated circuit package or a base stacking module can be mounted over the package substrate first surface 410. A seal material 418 such as a mold seal material or a dam seal material can be formed with a material such as an under-fill material, a dam encapsulant epoxy material, or other material. The seal material 418 can provide a seal or barrier for forming the package encapsulant 402 over the base package 416 thereby preventing the package encapsulant 402 from bleeding out through the package substrate cavity 406.

The base package 416 can include a base substrate 420 having a base substrate first surface 422 and a base substrate second surface 424. A base integrated circuit 426 can be attached or mounted over the base substrate first surface 422. An base attach layer 428 such as an adhesive, a film, a fill, or other material can be formed over a non-active surface of the base integrated circuit 426 and the base substrate first surface 422 for adhesion, structural integrity, thermal isolation, or thermal conductivity.

Base die connectors 430 such as bond wires, planar connectors, tab connectors, tape connectors, or other connectors can electrically connect the base integrated circuit 426 to the base substrate first surface 422. The base substrate 420 can be electrically connected to the package substrate 404 by base package connectors 432. A base encapsulant 434 can be formed on a side opposite the base package connectors 432 to protect the base integrated circuit 426, the base die connectors 430, and a portion of the base substrate second surface 424.

A top integrated circuit 436 can be attached or mounted over the base package 416 with a top attach layer 438 such as an adhesive, a film, a fill, or other material. The top attach layer 438 can be applied over the base encapsulant 434 and a non-active surface of the top integrated circuit 436. Top die connectors 440 can electrically connect the top integrated circuit 436 to the package substrate conductors 408 of the package substrate 404.

The package encapsulant 402 can be formed over the top integrated circuit 436, the top die connectors 440, the base package 416, the seal material 418, and a portion of the package substrate first surface 410 including the package substrate conductors 408. The package encapsulant 402 can optionally provide a portion of the package substrate first surface 410 substantially exposed.

The package substrate cavity 406 with the seal material 418 forms a region providing a vertical spacing from about an outer extent of the base package connectors 432 to about an outer extent of the package connectors 414. The vertical spacing of the region formed by the package substrate cavity 406 with the seal material 418 eliminates restrictions or limitations based on extents of the package substrate 404.

A second integrated circuit package 442 such as a dual row quad flat no-lead can be attached or mounted partially within the package substrate cavity 406 over an outer extent of the base package 416. The second integrated circuit package 442 can be electrically connected to the base package connectors 432 and have an outer extent within the outer extent of the package connectors 414.

Figure 5:
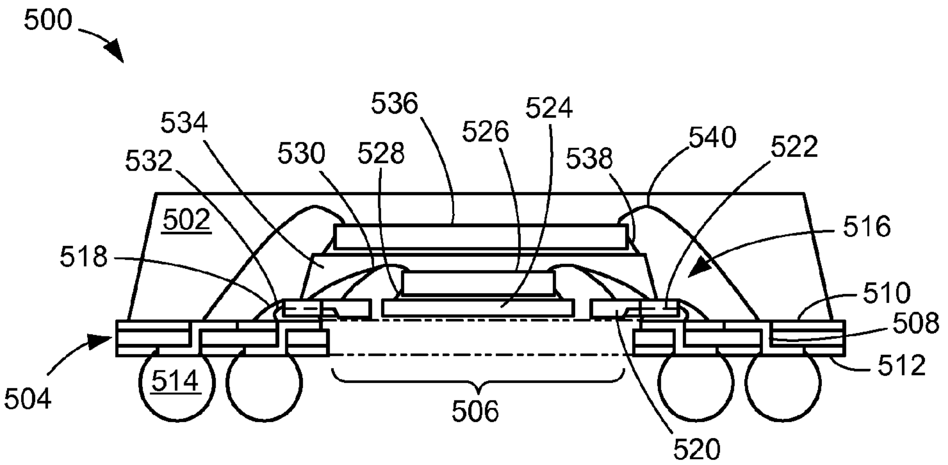
FIG. 5 is a cross-sectional view of an integrated circuit package system taken along line 5-5 of FIG. 6 in a fourth embodiment of the present invention.
Figure 6:
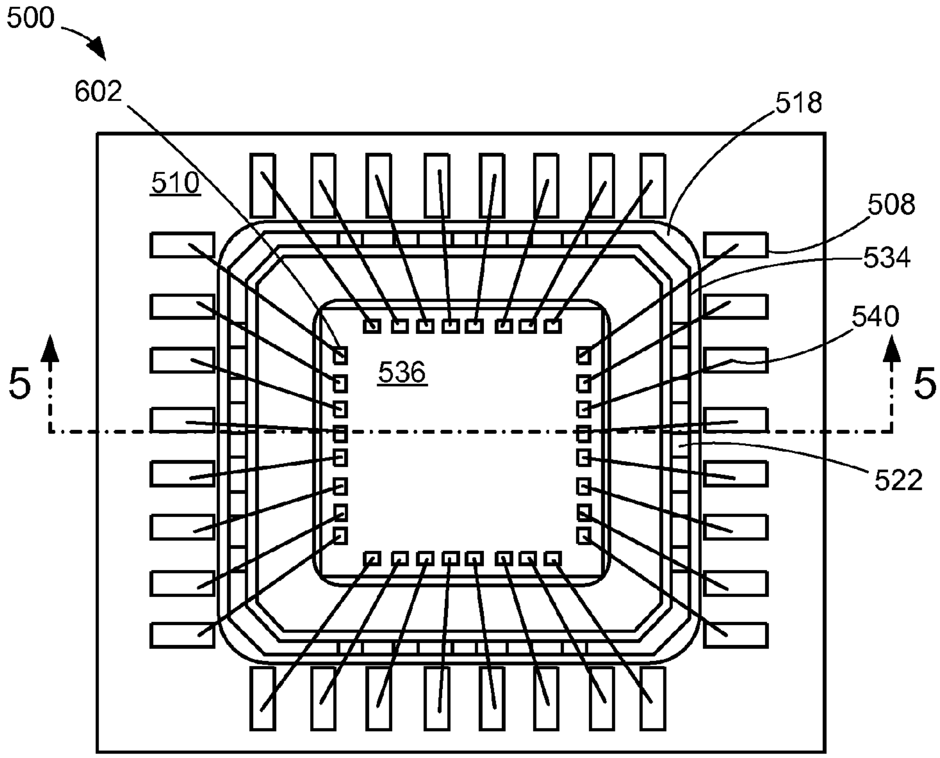
FIG. 6 is a top plan view of the integrated circuit package system in a die connect phase.

Referring now to FIG. 5, therein is shown a cross-sectional view of an integrated circuit package system 500 taken along line 5-5 of FIG. 6 in a fourth embodiment of the present invention. The integrated circuit package system 500 preferably includes a package encapsulant 502 such as a mold material over a package substrate 504 having a package substrate cavity 506. Package substrate conductors 508 such as metal, semiconductors, or combination thereof, can connect a package substrate first surface 510 and a package substrate second surface 512.

Package connectors 514 such as solder balls, exposed leads, lands, pins, or other connectors can be formed over the package substrate second surface 512. Components within the integrated circuit package system 500 can optionally be electrically connected through the package substrate conductors 508 to the package connectors 514. The package connectors 514 can provide electrical connectivity to a next level system such as another package, a printed circuit board, a subsystem, or another system.

A base package 516 such as a quad flat no-lead can be mounted over the package substrate first surface 510. A seal material 518 such as a mold seal material or a dam seal material can be formed with a material such as an under-fill material, a dam encapsulant epoxy material, or other material. The seal material 518 can provide a seal or barrier for forming the package encapsulant 502 over the base package 516 thereby preventing the package encapsulant 502 from bleeding out through the package substrate cavity 506.

The base package 516 can include base inner leads 520, base outer leads 522, and a base die pad 524. A base integrated circuit 526 can be attached or mounted over the base die pad 524. An base attach layer 528 such as an adhesive, a film, a fill, or other material can be formed over a non-active surface of the base integrated circuit 526 and the base die pad 524 for adhesion, structural integrity, thermal isolation, or thermal conductivity.

Base die connectors 530 such as bond wires, planar connectors, tab connectors, tape connectors, or other connectors can electrically connect the base integrated circuit 526 to the base inner leads 520, or the base outer leads 522. The base outer leads 522 can be electrically connected to the package substrate conductors 508 by a package interconnect 532 such as a surface mount technology (SMT) solder interconnect. A base encapsulant 534 can be formed to protect the base integrated circuit 526, and the base die connectors 530.

A top integrated circuit 536 can be attached or mounted over the base package 516 with a top attach layer 538 such as an adhesive, a film, a fill, or other material. The top attach layer 538 can be applied over the base encapsulant 534 and a non-active surface of the top integrated circuit 536. Top die connectors 540 can electrically connect the top integrated circuit 536 to the package substrate conductors 508 of the package substrate 504.

The package encapsulant 502 can be formed over the top integrated circuit 536, the top die connectors 540, the base package 516, the seal material 518, and a portion of the package substrate first surface 510 including the package substrate conductors 508. The package encapsulant 502 can optionally provide a portion of the package substrate first surface 510 substantially exposed.

The package substrate cavity 506 with the seal material 518 forms a region providing a vertical spacing from about an outer extent of the base package 516 to about an outer extent of the package connectors 514. The vertical spacing of the region formed by the package substrate cavity 506 with the seal material 518 eliminates restrictions or limitations based on extents of the package substrate 504.

Referring now to FIG. 6, therein is shown a top plan view of the integrated circuit package system 500 in a die connect phase. The integrated circuit package system 500 preferably includes the package substrate first surface 510, the package substrate conductors 508, the seal material 518, the base encapsulant 534, the base outer leads 522, the top integrated circuit 536, and the top die connectors 540. The integrated circuit package system 500 can also include top die pads 602 such as bond pads or conductive pads on an active surface of the top integrated circuit 536.

The top die pads 602 provide electrical connectivity for the top integrated circuit 536 through the top die connectors 540 to the package substrate conductors 508. Electrical signals or electrical levels such as power, ground, or other level, can be transmitted from the top integrated circuit to the package substrate 504. The package substrate 504 can transmit electrical signals or electrical levels between the package substrate conductors 508, to the base integrated circuit 526 of the base package, or a next level system.

For illustrative purposes, the top die connectors 540 are shown connecting one of the top die pads 602 to one of the package substrate conductors 508 although it is understood that any number of the top die connectors 540 may be connected to one of the package substrate conductors 508. Further for illustrative purposes, all of the top die pads 602 and the package substrate conductors 508 are shown connected to the top die connectors 540 although it is understood that any number of the top die pads 602 or the package substrate conductors 508 may be unconnected.

Figure 7:
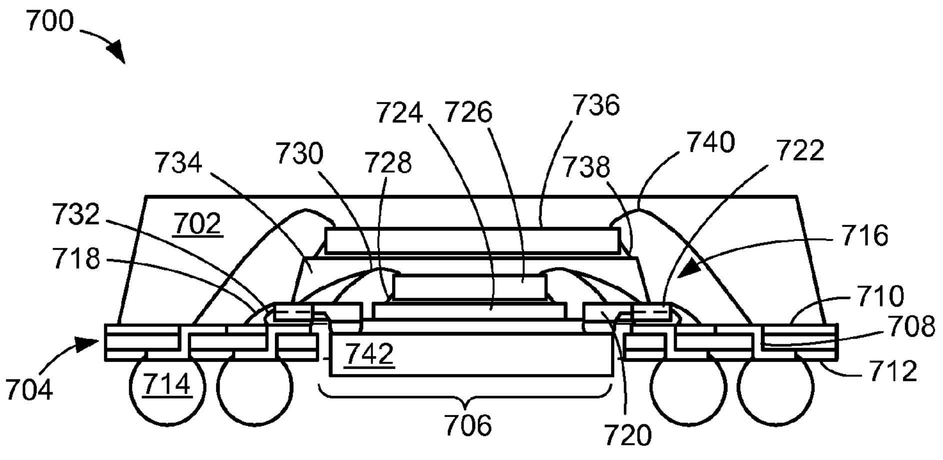
FIG. 7 is a cross-sectional view of an integrated circuit package system in a fifth embodiment of the present invention.

Referring now to FIG. 7, therein is shown a cross-sectional view of an integrated circuit package system 700 in a fifth embodiment of the present invention. The integrated circuit package system 700 preferably includes a package encapsulant 702 such as a mold material over a package substrate 704 having a package substrate cavity 706. Package substrate conductors 708 such as metal, semiconductors, or combination thereof, can connect a package substrate first surface 710 and a package substrate second surface 712.

Package connectors 714 such as solder balls, exposed leads, lands, pins, or other connectors can be formed over the package substrate second surface 712. Components within the integrated circuit package system 700 can optionally be electrically connected through the package substrate conductors 708 to the package connectors 714. The package connectors 714 can provide electrical connectivity to a next level system such as another package, a printed circuit board, a subsystem, or another system.

A base package 716 such as a quad flat no-lead can be mounted over the package substrate first surface 710. A seal material 718 such as a mold seal material or a dam seal material can be formed with a material such as an under-fill material, a dam encapsulant epoxy material, or other material. The seal material 718 can provide a seal or barrier for forming the package encapsulant 702 over the base package 716 thereby preventing the package encapsulant 702 from bleeding out through the package substrate cavity 706.

The base package 716 can include base inner leads 720, base outer leads 722, and a base die pad 724. A base integrated circuit 726 can be attached or mounted over the base die pad 724. An base attach layer 728 such as an adhesive, a film, a fill, or other material can be formed over a non-active surface of the base integrated circuit 726 and the base die pad 724 for adhesion, structural integrity, thermal isolation, or thermal conductivity.

Base die connectors 730 such as bond wires, planar connectors, tab connectors, tape connectors, or other connectors can electrically connect the base integrated circuit 726 to the base inner leads 720, or the base outer leads 722. The base outer leads 722 can be electrically connected to the package substrate conductors 708 by a package interconnect 732 such as a surface mount technology solder interconnect. A base encapsulant 734 can be formed to protect the base integrated circuit 726, and the base die connectors 730.

A top integrated circuit 736 can be attached or mounted over the base package 716 with a top attach layer 738 such as an adhesive, a film, a fill, or other material. The top attach layer 738 can be applied over the base encapsulant 734 and a non-active surface of the top integrated circuit 736. Top die connectors 740 can electrically connect the top integrated circuit 736 to the package substrate conductors 708 of the package substrate 704.

The package encapsulant 702 can be formed over the top integrated circuit 736, the top die connectors 740, the base package 716, the seal material 718, and a portion of the package substrate first surface 710 including the package substrate conductors 708. The package encapsulant 702 can optionally provide a portion of the package substrate first surface 710 substantially exposed.

The package substrate cavity 706 with the seal material 718 forms a region providing a vertical spacing from about an outer extent of the base package 716 to about an outer extent of the package connectors 714. The vertical spacing of the region formed by the package substrate cavity 706 with the seal material 718 eliminates restrictions or limitations based on extents of the package substrate 704.

An electronic device 742 such as a flip chip die, ball grid array, land grid array, quad flat no-lead, quad flat package, bump chip carrier, wafer level chip scale package, or other device, can be attached or mounted partially within the package substrate cavity 706 over an outer extent of the base package 716. The electronic device 742 can be electrically connected to the package interconnect 732 and have an outer extent within the outer extent of the package connectors 714.

Figure 8:
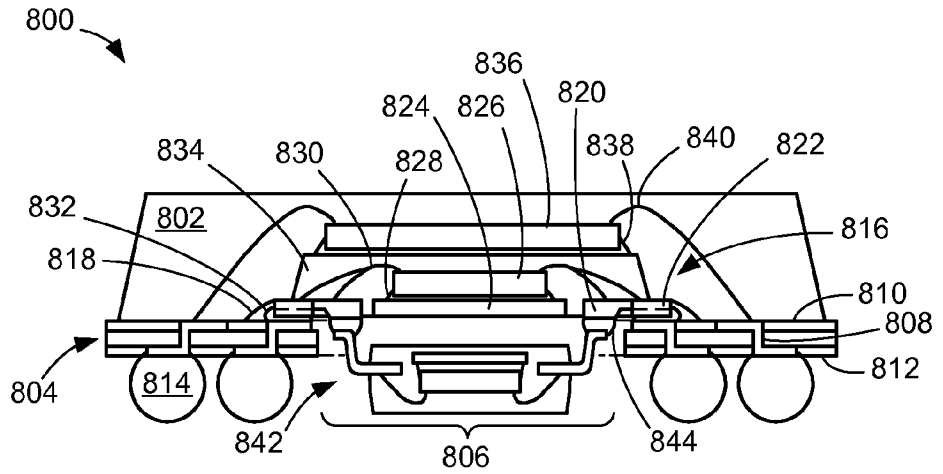
FIG. 8 is a cross-sectional view of an integrated circuit package system in a sixth embodiment of the present invention.

Referring now to FIG. 8, therein is shown a cross-sectional view of an integrated circuit package system 800 in a sixth embodiment of the present invention. The integrated circuit package system 800 preferably includes a package encapsulant 802 such as a mold material over a package substrate 804 having a package substrate cavity 806. Package substrate conductors 808 such as metal, semiconductors, or combination thereof, can connect a package substrate first surface 810 and a package substrate second surface 812.

Package connectors 814 such as solder balls, exposed leads, lands, pins, or other connectors can be formed over the package substrate second surface 812. Components within the integrated circuit package system 800 can optionally be electrically connected through the package substrate conductors 808 to the package connectors 814. The package connectors 814 can provide electrical connectivity to a next level system such as another package, a printed circuit board, a subsystem, or another system.

A base package 816 such as a quad flat no-lead can be mounted over the package substrate first surface 810. A seal material 818 such as a mold seal material or a dam seal material can be formed with a material such as an under-fill material, a dam encapsulant epoxy material, or other material. The seal material 818 can provide a seal or barrier for forming the package encapsulant 802 over the base package 816 thereby preventing the package encapsulant 802 from bleeding out through the package substrate cavity 806.

The base package 816 can include base inner leads 820, base outer leads 822, and a base die pad 824. A base integrated circuit 826 can be attached or mounted over the base die pad 824. An base attach layer 828 such as an adhesive, a film, a fill, or other material can be formed over a non-active surface of the base integrated circuit 826 and the base die pad 824 for adhesion, structural integrity, thermal isolation, or thermal conductivity.

Base die connectors 830 such as bond wires, planar connectors, tab connectors, tape connectors, or other connectors can electrically connect the base integrated circuit 826 to the base inner leads 820, or the base outer leads 822. The base outer leads 822 can be electrically connected to the package substrate conductors 808 by a package interconnect 832 such as a surface mount technology solder interconnect. A base encapsulant 834 can be formed to protect the base integrated circuit 826, and the base die connectors 830.

A top integrated circuit 836 can be attached or mounted over the base package 816 with a top attach layer 838 such as an adhesive, a film, a fill, or other material. The top attach layer 838 can be applied over the base encapsulant 834 and a non-active surface of the top integrated circuit 836. Top die connectors 840 can electrically connect the top integrated circuit 836 to the package substrate conductors 808 of the package substrate 804.

The package encapsulant 802 can be formed over the top integrated circuit 836, the top die connectors 840, the base package 816, the seal material 818, and a portion of the package substrate first surface 810 including the package substrate conductors 808. The package encapsulant 802 can optionally provide a portion of the package substrate first surface 810 substantially exposed.

The package substrate cavity 806 with the seal material 818 forms a region providing a vertical spacing from about an outer extent of the base package 816 to about an outer extent of the package connectors 814. The vertical spacing of the region formed by the package substrate cavity 806 with the seal material 818 eliminates restrictions or limitations based on extents of the package substrate 804.

An electronic device 842 such as a quad flat package, a Thin Shrink Small Outline Package (TSSOP), or other device, can be attached or mounted partially within the package substrate cavity 806 over an outer extent of the base package 816. The electronic device 842 can be electrically connected to the package interconnect 832 with a device interconnect 844 such as a surface mount technology solder interconnect, and have an outer extent within the outer extent of the package connectors 814.

Figure 9:
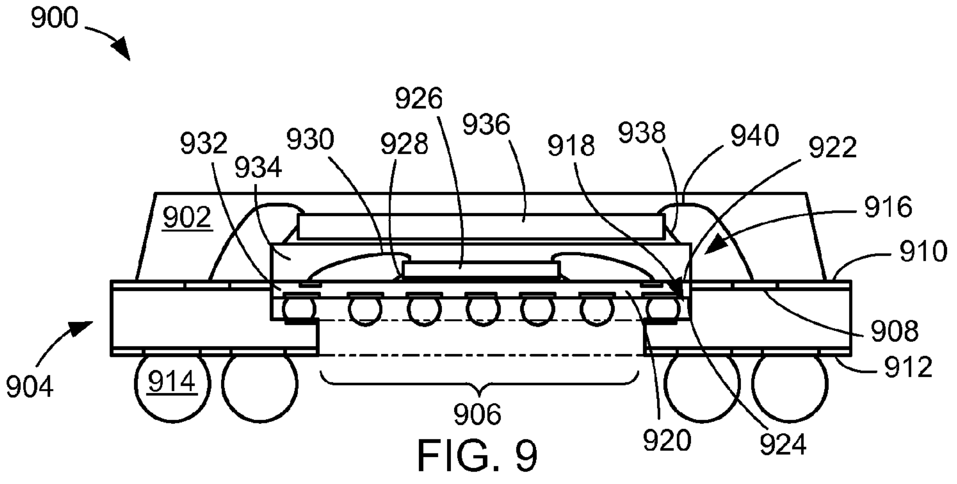
FIG. 9 is a cross-sectional view of an integrated circuit package system in a seventh embodiment of the present invention.

Referring now to FIG. 9, therein is shown a cross-sectional view of an integrated circuit package system 900 in a seventh embodiment of the present invention. The integrated circuit package system 900 preferably includes a package encapsulant 902 such as a mold material over a package substrate 904 having a package substrate cavity 906. Package substrate conductors 908 such as metal, semiconductors, or combination thereof, can connect a package substrate first surface 910 and a package substrate second surface 912.

For illustrative purposes, the package substrate 904 is shown having the package substrate first surface 910 and the package substrate second surface 912 although it is understood that the package substrate 904 may include any number of layers. Further, for illustrative purposes the package substrate conductors 908 are shown having one contiguous material although it is understood that the package substrate conductors 908 may be formed of different materials or in multiple layers.

Package connectors 914 such as solder balls, exposed leads, lands, pins, or other connectors can be formed over the package substrate second surface 912. Components within the integrated circuit package system 900 can optionally be electrically connected through the package substrate conductors 908 to the package connectors 914. The package connectors 914 can provide electrical connectivity to a next level system such as another package, a printed circuit board, a subsystem, or another system.

A base package 916 such as an integrated circuit package or a base stacking module can be mounted over the package substrate first surface 910. A package substrate recess 918 such as a recessed lead finger layer of the package substrate 904 can provide a mounting surface for the base package 916.

The base package 916 can include a base substrate 920 having a base substrate first surface 922 and a base substrate second surface 924. The base substrate 920 can be formed having predetermined dimensions substantially the same as spacing from one vertical edge of the package substrate recess 918 and an opposite vertical edge of the package substrate recess 918.

A base integrated circuit 926 can be attached or mounted over the base substrate first surface 922. An base attach layer 928 such as an adhesive, a film, a fill, or other material can be formed over a non-active surface of the base integrated circuit 926 and the base substrate first surface 922 for adhesion, structural integrity, thermal isolation, or thermal conductivity.

Base die connectors 930 such as bond wires, planar connectors, tab connectors, tape connectors, or other connectors can electrically connect the base integrated circuit 926 to the base substrate first surface 922. The base substrate 920 can be electrically connected to the package substrate 904 by base package connectors 932. A base encapsulant 934 can be formed on a side opposite the base package connectors 932 to protect the base integrated circuit 926, the base die connectors 930, and a portion of the base substrate second surface 924.

A top integrated circuit 936 can be attached or mounted over the base package 916 with a top attach layer 938 such as an adhesive, a film, a fill, or other material. The top attach layer 938 can be applied over the base encapsulant 934 and a non-active surface of the top integrated circuit 936. Top die connectors 940 can electrically connect the top integrated circuit 936 to the package substrate conductors 908 of the package substrate 904.

The package encapsulant 902 can be formed over the top integrated circuit 936, the top die connectors 940, the base package 916, and a portion of the package substrate first surface 910 including the package substrate conductors 908. The package encapsulant 902 can optionally provide a portion of the package substrate first surface 910 substantially exposed.

The package substrate cavity 906 with the package substrate recess 918 forms a region providing a vertical spacing from about an outer extent of the base package connectors 932 to about an outer extent of the package connectors 914. The vertical spacing of the region formed by the package substrate cavity 906 with the package substrate recess 918 eliminates restrictions or limitations based on extents of the package substrate 904.

Figure 10:
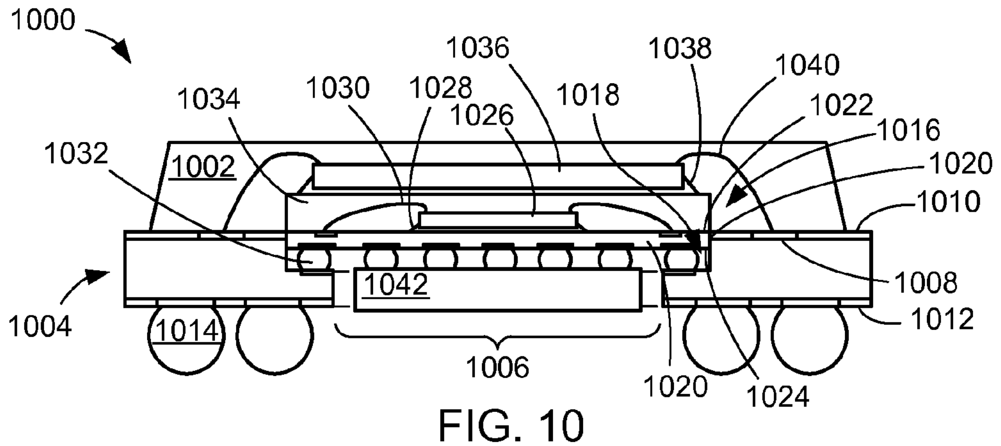
FIG. 10 is a cross-sectional view of an integrated circuit package system in an eighth embodiment of the present invention.

Referring now to FIG. 10, therein is shown a cross-sectional view of an integrated circuit package system 1000 in an eighth embodiment of the present invention. The integrated circuit package system 1000 preferably includes a package encapsulant 1002 such as a mold material over a package substrate 1004 having a package substrate cavity 1006. Package substrate conductors 1008 such as metal, semiconductors, or combination thereof, can connect a package substrate first surface 1010 and a package substrate second surface 1012.

For illustrative purposes, the package substrate 1004 is shown having the package substrate first surface 1010 and the package substrate second surface 1012 although it is understood that the package substrate 1004 may include any number of layers. Further, for illustrative purposes the package substrate conductors 1008 are shown having one contiguous material although it is understood that the package substrate conductors 1008 may be formed of different materials or in multiple layers.

Package connectors 1014 such as solder balls, exposed leads, lands, pins, or other connectors can be formed over the package substrate second surface 1012. Components within the integrated circuit package system 1000 can optionally be electrically connected through the package substrate conductors 1008 to the package connectors 1014. The package connectors 1014 can provide electrical connectivity to a next level system such as another package, a printed circuit board, a subsystem, or another system.

A base package 1016 such as an integrated circuit package or a base stacking module can be mounted over the package substrate first surface 1010. A package substrate recess 1018 such as a recessed lead finger layer of the package substrate 1004 can provide a mounting surface for the base package 1016.

The base package 1016 can include a base substrate 1020 having a base substrate first surface 1022 and a base substrate second surface 1024. The base substrate 1020 can be formed having predetermined dimensions substantially the same as spacing from one vertical edge of the package substrate recess 1018 and an opposite vertical edge of the package substrate recess 1018.

A base integrated circuit 1026 can be attached or mounted over the base substrate first surface 1022. An base attach layer 1028 such as an adhesive, a film, a fill, or other material can be formed over a non-active surface of the base integrated circuit 1026 and the base substrate first surface 1022 for adhesion, structural integrity, thermal isolation, or thermal conductivity.

Base die connectors 1030 such as bond wires, planar connectors, tab connectors, tape connectors, or other connectors can electrically connect the base integrated circuit 1026 to the base substrate first surface 1022. The base substrate 1020 can be electrically connected to the package substrate 1004 by base package connectors 1032. A base encapsulant 1034 can be formed on a side opposite the base package connectors 1032 to protect the base integrated circuit 1026, the base die connectors 1030, and a portion of the base substrate second surface 1024.

A top integrated circuit 1036 can be attached or mounted over the base package 1016 with a top attach layer 1038 such as an adhesive, a film, a fill, or other material. The top attach layer 1038 can be applied over the base encapsulant 1034 and a non-active surface of the top integrated circuit 1036. Top die connectors 1040 can electrically connect the top integrated circuit 1036 to the package substrate conductors 1008 of the package substrate 1004.

The package encapsulant 1002 can be formed over the top integrated circuit 1036, the top die connectors 1040, the base package 1016, and a portion of the package substrate first surface 1010 including the package substrate conductors 1008. The package encapsulant 1002 can optionally provide a portion of the package substrate first surface 1010 substantially exposed.

The package substrate cavity 1006 with the package substrate recess 1018 forms a region providing a vertical spacing from about an outer extent of the base package connectors 1032 to about an outer extent of the package connectors 1014. The vertical spacing of the region formed by the package substrate cavity 1006 with the package substrate recess 1018 eliminates restrictions or limitations based on extents of the package substrate 1004.

An electronic device 1042 such as a flip chip die, ball grid array, land grid array, quad flat no-lead, quad flat package, bump chip carrier, wafer level chip scale package, or other device, can be attached or mounted partially within the package substrate cavity 1006 over an outer extent of the base package 1016. The electronic device 1042 can be electrically connected to the base package connectors 1032 and have an outer extent within the outer extent of the package connectors 1014.

Figure 11:
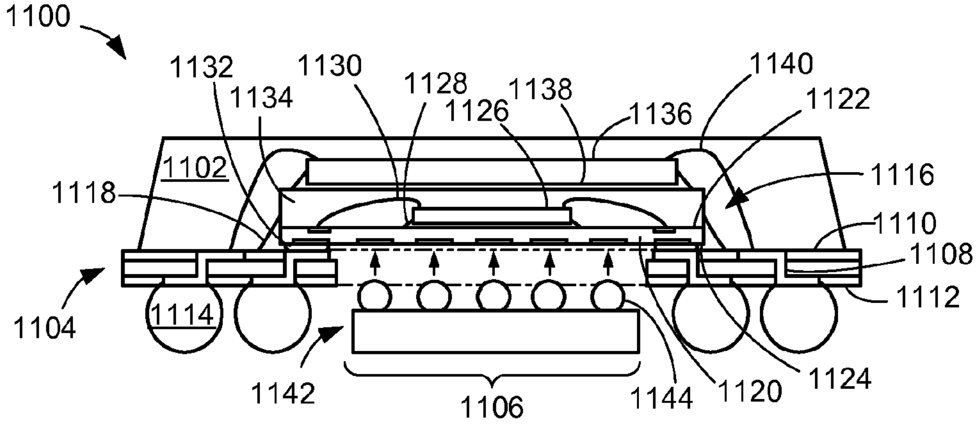
FIG. 11 is a cross-sectional view of an integrated circuit package system in a ninth embodiment of the present invention.

Referring now to FIG. 11, therein is shown a cross-sectional view of an integrated circuit package system 1100 in a ninth embodiment of the present invention. The integrated circuit package system 1100 preferably includes a package encapsulant 1102 such as a mold material over a package substrate 1104 having a package substrate cavity 1106. Package substrate conductors 1108 such as metal, semiconductors, or combination thereof, can connect a package substrate first surface 1110 and a package substrate second surface 1112.

Package connectors 1114 such as solder balls, exposed leads, lands, pins, or other connectors can be formed over the package substrate second surface 1112. Components within the integrated circuit package system 1100 can optionally be electrically connected through the package substrate conductors 1108 to the package connectors 1114. The package connectors 1114 can provide electrical connectivity to a next level system such as another package, a printed circuit board, a subsystem, or another system.

A base package 1116 such as an integrated circuit package or a base stacking module can be mounted over the package substrate first surface 1110. A seal material 1118 such as a mold seal material or a dam seal material can be formed with a material such as an under-fill material, a dam encapsulant epoxy material, or other material. The seal material 1118 can provide a seal or barrier for forming the package encapsulant 1102 over the base package 1116 thereby preventing the package encapsulant 1102 from bleeding out through the package substrate cavity 1106.

The base package 1116 can include a base substrate 1120 having a base substrate first surface 1122 and a base substrate second surface 1124. A base integrated circuit 1126 can be attached or mounted over the base substrate first surface 1122. An base attach layer 1128 such as an adhesive, a film, a fill, or other material can be formed over a non-active surface of the base integrated circuit 1126 and the base substrate first surface 1122 for adhesion, structural integrity, thermal isolation, or thermal conductivity.

Base die connectors 1130 such as bond wires, planar connectors, tab connectors, tape connectors, or other connectors can electrically connect the base integrated circuit 1126 to the base substrate first surface 1122. The base substrate 1120 can be electrically connected to the package substrate 1104 by a package interconnect 1132. A base encapsulant 1134 can be formed on a side opposite the package interconnect 1132 to protect the base integrated circuit 1126, the base die connectors 1130, and a portion of the base substrate second surface 1124.

A top integrated circuit 1136 can be attached or mounted over the base package 1116 with a top attach layer 1138 such as an adhesive, a film, a fill, or other material. The top attach layer 1138 can be applied over the base encapsulant 1134 and a non-active surface of the top integrated circuit 1136. Top die connectors 1140 can electrically connect the top integrated circuit 1136 to the package substrate conductors 1108 of the package substrate 1104.

The package encapsulant 1102 can be formed over the top integrated circuit 1136, the top die connectors 1140, the base package 1116, the seal material 1118, and a portion of the package substrate first surface 1110 including the package substrate conductors 1108. The package encapsulant 1102 can optionally provide a portion of the package substrate first surface 1110 substantially exposed.

The package substrate cavity 1106 with the seal material 1118 forms a region providing a vertical spacing from about an outer extent of the base substrate second surface 1124 to about an outer extent of the package connectors 1114. The vertical spacing of the region formed by the package substrate cavity 1106 with the seal material 1118 eliminates restrictions or limitations based on extents of the package substrate 1104.

An electronic device 1142 such as a flip chip die, ball grid array, land grid array, quad flat no-lead, quad flat package, bump chip carrier, wafer level chip scale package, or other device, can be attached or mounted partially within the package substrate cavity 1106 over an outer extent of the base package 1116. The electronic device 1142 can be integrated with the base substrate second surface 1124 with a device interconnect 1144 such as a surface mount technology solder interconnect and have an outer extent within the outer extent of the package connectors 1114.

Figure 12:
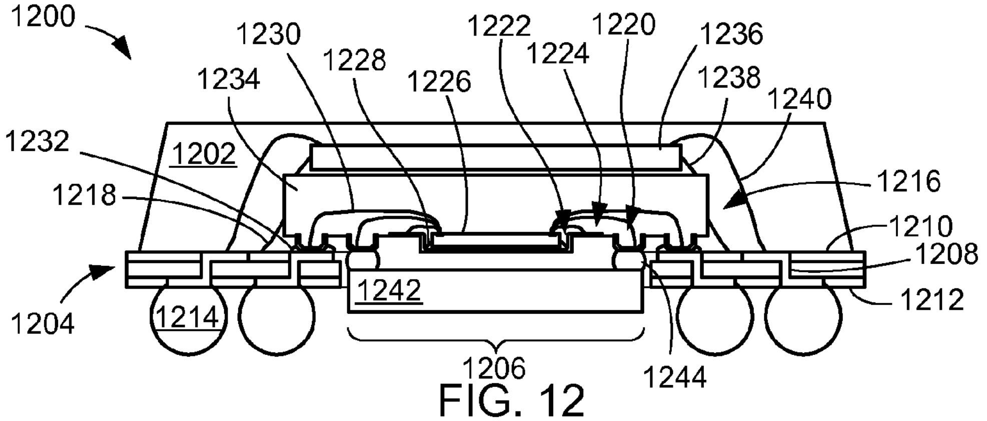
FIG. 12 is a cross-sectional view of an integrated circuit package system in a tenth embodiment of the present invention.

Referring now to FIG. 12, therein is shown a cross-sectional view of an integrated circuit package system 1200 in a tenth embodiment of the present invention. The integrated circuit package system 1200 preferably includes a package encapsulant 1202 such as a mold material over a package substrate 1204 having a package substrate cavity 1206. Package substrate conductors 1208 such as metal, semiconductors, or combination thereof, can connect a package substrate first surface 1210 and a package substrate second surface 1212.

Package connectors 1214 such as solder balls, exposed leads, lands, pins, or other connectors can be formed over the package substrate second surface 1212. Components within the integrated circuit package system 1200 can optionally be electrically connected through the package substrate conductors 1208 to the package connectors 1214. The package connectors 1214 can provide electrical connectivity to a next level system such as another package, a printed circuit board, a subsystem, or another system.

A base package 1216 such as a bump chip carrier can be mounted over the package substrate first surface 1210. A seal material 1218 such as a mold seal material or a dam seal material can be formed with a material such as an under-fill material, a dam encapsulant epoxy material, or other material. The seal material 1218 can provide a seal or barrier for forming the package encapsulant 1202 over the base package 1216 thereby preventing the package encapsulant 1202 from bleeding out through the package substrate cavity 1206.

The base package 1216 can include a base terminal 1220, a base die pad 1222, and base interconnect regions 1224. A base integrated circuit 1226 can be attached or mounted over the base die pad 1222. A base attach layer 1228 such as an adhesive, a film, a fill, or other material can be formed over a non-active surface of the base integrated circuit 1226 and the base die pad 1222 for adhesion, structural integrity, thermal isolation, or thermal conductivity.

Base die connectors 1230 such as bond wires, planar connectors, tab connectors, tape connectors, or other connectors can electrically connect the base integrated circuit 1226 to the base interconnect regions 1224. The base terminal 1220 can be connected to the package substrate 1204 by a package interconnect 1232 such as a surface mount technology solder interconnect. A base encapsulant 1234 can be formed on a side opposite the package interconnect 1232 to protect the base integrated circuit 1226, the base die connectors 1230, and a internal portion of the base terminal 1220, the base die pad 1222, and the base interconnect regions 1224 on a side having the base integrated circuit 1226.

A top integrated circuit 1236 can be attached or mounted over the base package 1216 with a top attach layer 1238 such as an adhesive, a film, a fill, or other material. The top attach layer 1238 can be applied over the base encapsulant 1234 and a non-active surface of the top integrated circuit 1236. Top die connectors 1240 can electrically connect the top integrated circuit 1236 to the package substrate conductors 1208 of the package substrate 1204.

The package encapsulant 1202 can be formed over the top integrated circuit 1236, the top die connectors 1240, the base package 1216, the seal material 1218, and a portion of the package substrate first surface 1210 including the package substrate conductors 1208. The package encapsulant 1202 can optionally provide a portion of the package substrate first surface 1210 substantially exposed.

The package substrate cavity 1206 with the seal material 1218 forms a region providing a vertical spacing from about an outer extent of the base terminal 1220 or the base die pad 1222 to about an outer extent of the package connectors 1214. The vertical spacing of the region formed by the package substrate cavity 1206 with the seal material 1218 eliminates restrictions or limitations based on extents of the package substrate 1204.

An electronic device 1242 such as a flip chip die, ball grid array, land grid array, quad flat no-lead, quad flat package, bump chip carrier, wafer level chip scale package, or other device, can be attached or mounted partially within the package substrate cavity 1206 over an outer extent of the base package 1216. The electronic device 1242 can be electrically connected to the base terminal 1220 with the device interconnect 844 such as solder bump and have an outer extent within the outer extent of the package connectors 1214.

Figure 13:
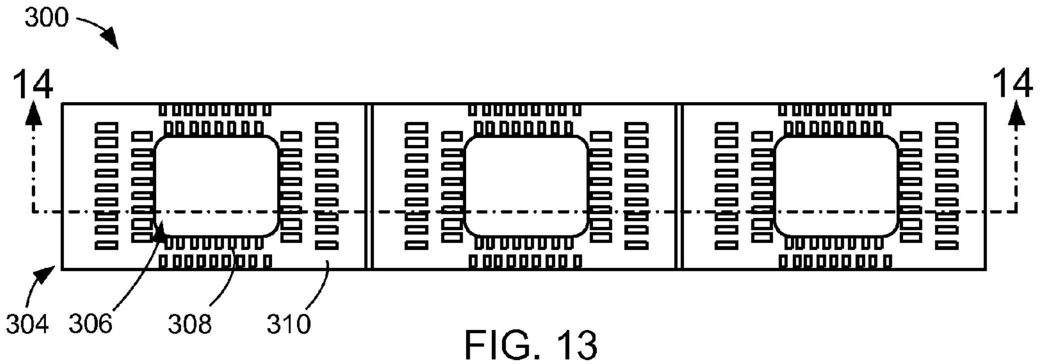
FIG. 13 is a top plan view of the integrated circuit package system in a frame formation phase.

Referring now to FIG. 13, therein is shown a top plan view of the integrated circuit package system 300 in a frame formation phase. The integrated circuit package system 300 preferably includes the package substrate 304 having the package substrate cavity 306. The package substrate conductors 308 can connect the package substrate first surface 310 and the package substrate second surface 312 of FIG. 3.

The package substrate conductors 308 can provide a connection surface for components or connectors. For illustrative purposes, the integrated circuit package system 300 is shown having three of the package substrate 304 in a strip or a matrix although it is understood that any number of the package substrate 304 may be formed.

Figure 14:
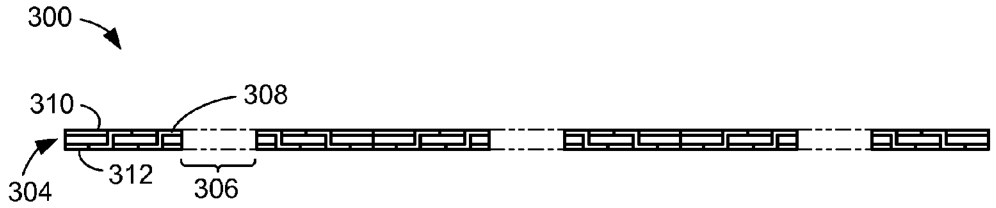
FIG. 14 is a cross-sectional view of the structure of FIG. 13 taken along line 14-14 of FIG. 13.

Referring now to FIG. 14, therein is shown a cross-sectional view of the structure of FIG. 13 taken along line 14-14 of FIG. 13. The integrated circuit package system 300 preferably includes the package substrate 304 having the package substrate cavity 306. The package substrate conductors 308 can connect the package substrate first surface 310 and the package substrate second surface 312. The package substrate conductors 308 can provide a connection surface for components or connectors.

Figure 15:
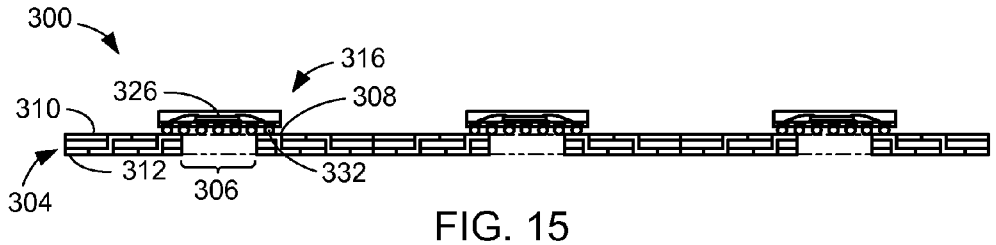
FIG. 15 is a cross-sectional view of the structure of FIG. 14 in a chip attach phase.

Referring now to FIG. 15, therein is shown a cross-sectional view of the structure of FIG. 14 in a chip attach phase. The integrated circuit package system 300 preferably includes the package substrate 304 having the package substrate cavity 306, the package substrate conductors 308, the package substrate first surface 310, and the package substrate second surface 312.

The base package 316 can be mounted over the package substrate cavity 306 and the package substrate first surface 310. The base package connectors 332 can connect the base package 316 and the package substrate conductors 308. The base integrated circuit 326 of the base package 316 can be electrically connected through the package substrate 304.

Figure 16:
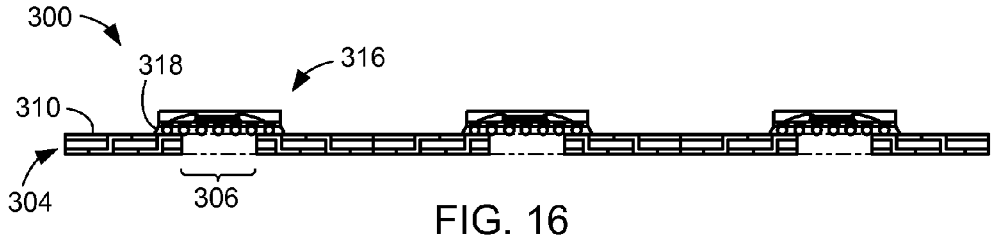
FIG. 16 is a cross-sectional view of the structure of FIG. 15 in a cavity seal phase.

Referring now to FIG. 16, therein is shown a cross-sectional view of the structure of FIG. 15 in a cavity seal phase. The integrated circuit package system 300 preferably includes the package substrate 304 having the package substrate cavity 306, the package substrate conductors 308, the base package 316 over the package substrate cavity 306, and the seal material 318 adjacent the base package 316.

The seal material 318 can provide a seal or barrier for forming the package encapsulant 302 of FIG. 3 over the base package 316 thereby preventing the package encapsulant 302 from bleeding out through the package substrate cavity 306. The package substrate cavity 306 with the seal material 318 forms a region providing a vertical spacing from about an outer extent of the base package connectors 332 to about an outer extent of the package connectors 314.

Figure 17:
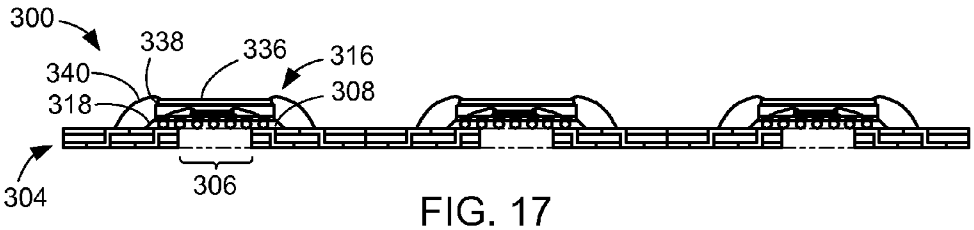
FIG. 17 is a cross-sectional view of the structure of FIG. 16 in a die connect phase.

Referring now to FIG. 17, therein is shown a cross-sectional view of the structure of FIG. 16 in a die connect phase. The integrated circuit package system 300 preferably includes the package substrate 304 having the package substrate conductors 308, the base package 316 over the package substrate cavity 306, the seal material 318 adjacent the base package 316, and the top integrated circuit 336.

The top integrated circuit 336 can be attached or mounted over the base package 316 with the top attach layer 338. The top die connectors 340 can electrically connect the top integrated circuit 336 and the package substrate conductors 308 thereby connecting the top integrated circuit 336 through the package substrate 304.

Figure 18:
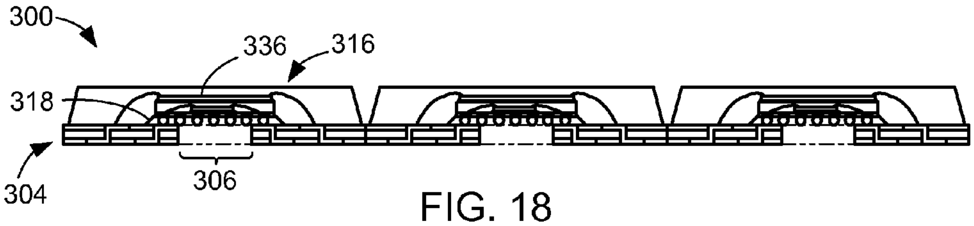
FIG. 18 is a cross-sectional view of the structure of FIG. 17 in a package mold phase.

Referring now to FIG. 18, therein is shown a cross-sectional view of the structure of FIG. 17 in a package mold phase. The integrated circuit package system 300 preferably includes the package substrate 304 having the package substrate cavity 306, the base package 316 over the package substrate 304, the seal material 318 adjacent the base package 316, and the top integrated circuit 336 over the base package 316.

The seal material 318 can provide a seal or barrier for forming the package encapsulant 302 over the base package 316 thereby preventing the package encapsulant 302 from bleeding out through the package substrate cavity 306. The package encapsulant 302 can be formed over the top integrated circuit 336, the base package 316, the seal material 318, and a portion of the package substrate 304. The package encapsulant 302 can optionally provide a portion of the package substrate 304 substantially exposed.

Figure 19:
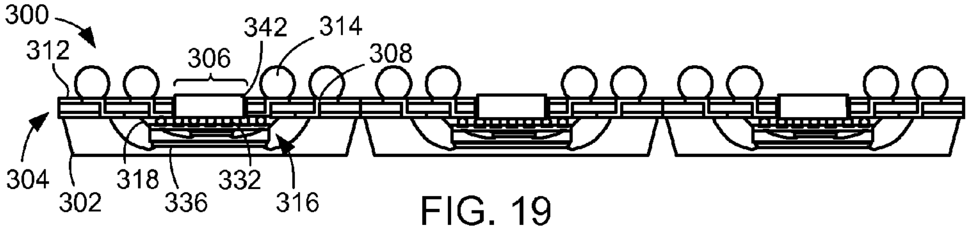
FIG. 19 is a cross-sectional view of the structure of FIG. 18 in a connector formation phase.

Referring now to FIG. 19, therein is shown a cross-sectional view of the structure of FIG. 18 in a connector formation phase. The integrated circuit package system 300 preferably includes the package substrate 304 having the package substrate cavity 306, the base package 316 over the package substrate 304, the seal material 318 adjacent the base package 316, and the top integrated circuit 336 over the base package 316.

The electronic device 342 can be attached or mounted partially within the package substrate cavity 306 over an outer extent of the base package 316. The electronic device 342 can be electrically connected to the base package connectors 332 and have an outer extent within the outer extent of the package connectors 314.

Optionally, the package connectors 314 can be formed over the package substrate second surface 312 or the package substrate conductors 308. The package connectors 314 can provide electrical connectivity to components within the integrated circuit package system 300 and the next level system.

Figure 20:
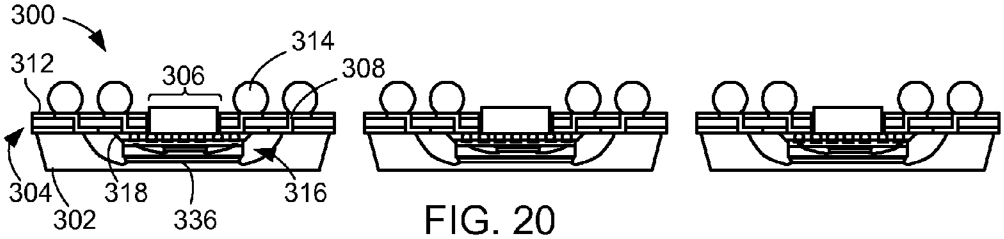
FIG. 20 is a cross-sectional view of the structure of FIG. 19 in a package singulation phase.

Referring now to FIG. 20, therein is shown a cross-sectional view of the structure of FIG. 19 in a package singulation phase. The integrated circuit package system 300 preferably includes the package substrate 304 having the package substrate cavity 306, the base package 316 over the package substrate 304, the seal material 318 adjacent the base package 316, and the top integrated circuit 336 over the base package 316.

Each of the integrated circuit package system 300 can be individualized, separated, or singulated from another of the integrated circuit package system 300. A singulation process can include an apparatus (not shown) such as laser, saw, blade, water jet, or other singulation apparatus. The singulation process can provide each of the integrated circuit package system 300 for integration with the next level system.

Optionally, the package connectors 314 can be formed over the package substrate second surface 312 or the package substrate conductors 308. The package connectors 314 can provide electrical connectivity to components within the integrated circuit package system 300 and the next level system.

Figure 21:
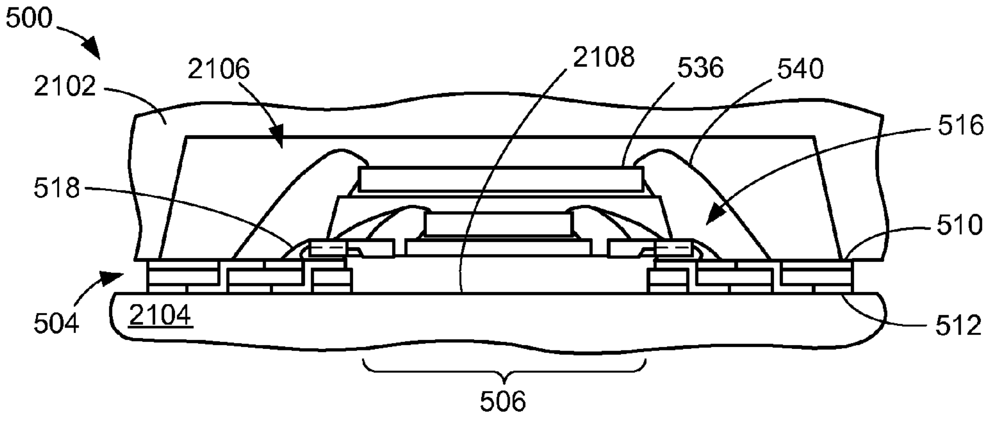
FIG. 21 is a cross-sectional view of the integrated circuit package system in a mold application phase.

Referring now to FIG. 21, therein is shown a cross-sectional view of the integrated circuit package system 500 in a mold application phase. The integrated circuit package system 500 preferably includes a top mold chase 2102 and a bottom mold chase 2104 for supporting or sealing the integrated circuit package system 500 over the structure of FIG. 6 including the package substrate cavity 506 and the seal material 518.

The top mold chase 2102 includes a top chase cavity 2106 having predetermined dimensions with spacing for the base package 516, the top integrated circuit 536, and the top die connectors 540. The top chase cavity 2106 provides a region for conformal molding of the package encapsulant 502 of FIG. 5. The top mold chase 2102 can be placed on the package substrate first surface 510 for sealing the integrated circuit package system 500.

The bottom mold chase 2104 is formed having a bottom chase inner surface 2108 providing a substantially planar surface for supporting the package substrate 504 or sealing the integrated circuit package system 500 and providing the package substrate cavity 506 substantially sealed. The bottom chase inner surface 2108 can be placed on the package substrate second surface 512 opposite the top mold chase 2102.

Figure 22:
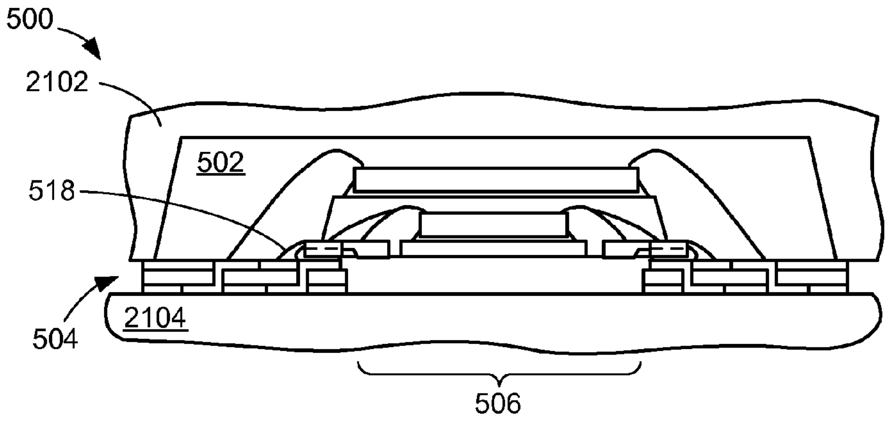
FIG. 22 is a cross-sectional view of the structure of FIG. 21 in an encapsulant mold phase.

Referring now to FIG. 22, therein is shown a cross-sectional view of the structure of FIG. 21 in an encapsulant mold phase. The integrated circuit package system 500 preferably includes the top mold chase 2102, the bottom mold chase 2104, and the package encapsulant 502 over the package substrate 504 having the package substrate cavity 506.

The package encapsulant 502 can conform to the top chase cavity 2106 and the seal material 518 thereby preventing the package encapsulant 502 from bleeding out through the package substrate cavity 506. The bottom mold chase 2104 and the seal material 518 substantially eliminate forming the package encapsulant 502 in the package substrate cavity 506.

Figure 23:
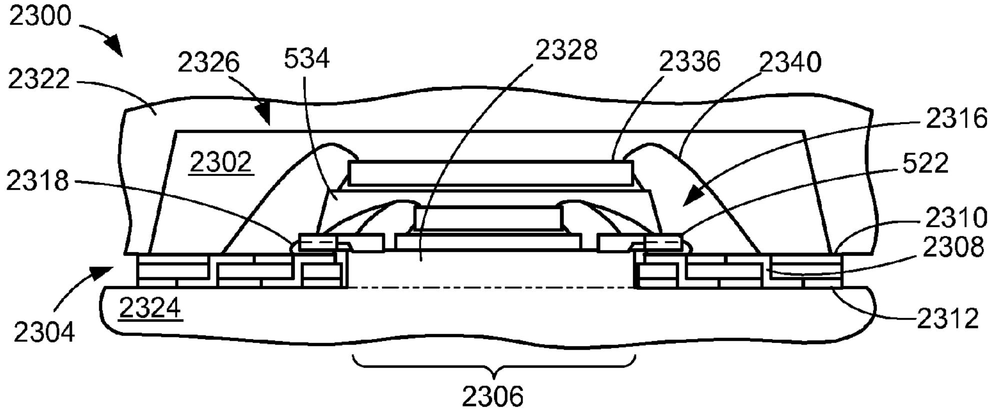
FIG. 23 is a cross-sectional view of an integrated circuit package system in an eleventh embodiment of the present invention.

Referring now to FIG. 23, therein is shown a cross-sectional view of an integrated circuit package system 2300 in an encapsulant mold phase of an eleventh embodiment of the present invention. Similar to the integrated circuit package system 500 of FIG. 5, the integrated circuit package system 2300 preferably includes a package encapsulant 2302 such as a mold material over a package substrate 2304 having a package substrate cavity 2306, package substrate conductors 2308, a package substrate first surface 2310, and a package substrate second surface 2312.

A base package 2316 such as a quad flat no-lead or a land grid array can be mounted over the package substrate first surface 2310. The base package 2316 can be electrically connected to the package substrate conductors 2308 by a package interconnect 2318 such as a surface mount technology solder interconnect. The package interconnect 2318 can provide a seal or barrier for forming the package encapsulant 2302 over the package substrate 2304 having the package substrate cavity 2306.

The integrated circuit package system 2300 including the base package 2316 can be placed in a top mold chase 2322 and a bottom mold chase 2324. The top mold chase 2322 and the bottom mold chase 2324 can provide support or sealing of the integrated circuit package system 2300 including the package substrate cavity 2306 during an encapsulation process such as molding.

The top mold chase 2322 includes a top chase cavity 2326 having predetermined dimensions with spacing for the base package 2316, a top integrated circuit 2336, and top die connectors 2340. The top chase cavity 2326 provides a region for conformal molding of the package encapsulant 2302. The top mold chase 2322 can be placed on the package substrate first surface 2310 for sealing the integrated circuit package system 2300.

The bottom mold chase 2324 is formed having a bottom chase step 2328 such as a bottom chase bias providing a block or a barrier for mold flow and substantially sealing the package substrate cavity 2306. The bottom chase step 2328 can be placed on the package substrate second surface 2312 opposite the top mold chase 2322 requiring a significantly higher force to ensure direct contact and substantially eliminate mold bleed.

The package encapsulant 2302 can conform to the top chase cavity 2326 and the bottom chase step 2328 thereby preventing the package encapsulant 2302 from bleeding out through the package substrate cavity 2306. The bottom mold chase 2324 and the package interconnect 2318 substantially eliminate forming the package encapsulant 2302 in the package substrate cavity 2306.

Figure 24:
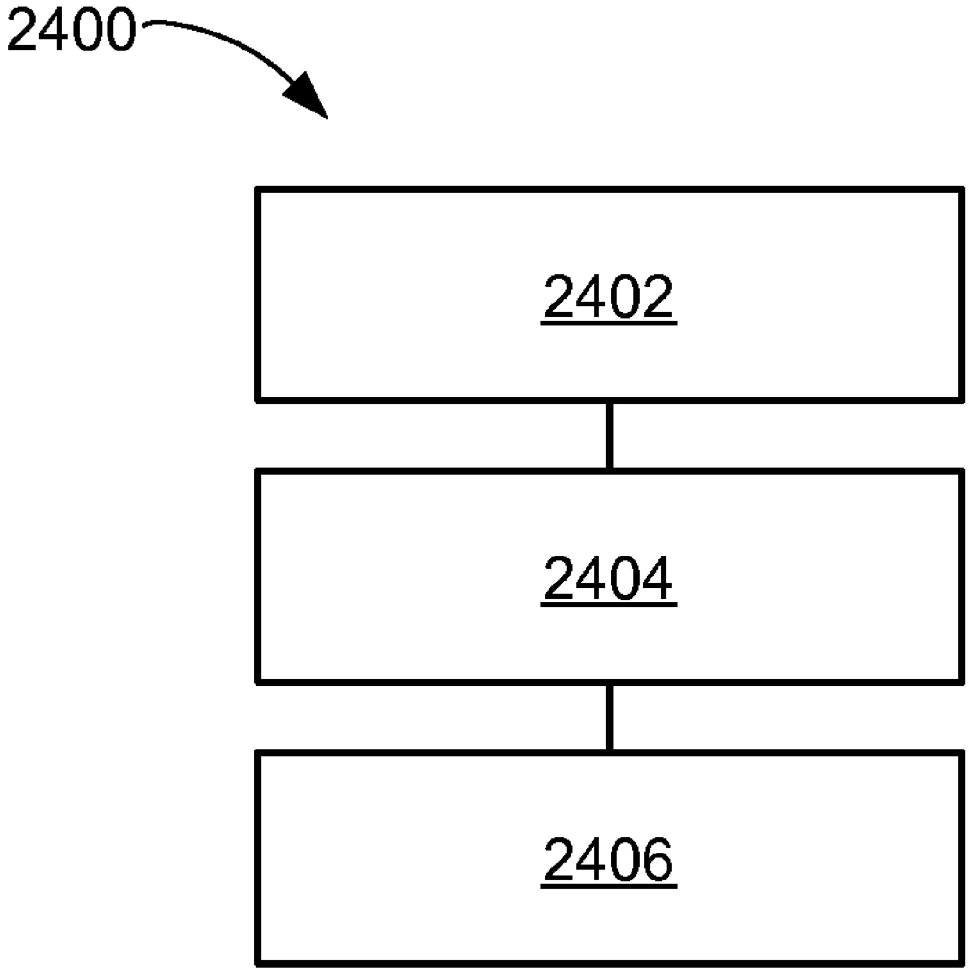
FIG. 24 is a flow chart of an integrated circuit package system for manufacturing the integrated circuit package system in an embodiment of the present invention.

Referring now to FIG. 24, therein is shown a flow chart of an integrated circuit package system 2400 for manufacturing the integrated circuit package system 100 in an embodiment of the present invention. The system 2400 includes providing a substrate having a cavity in a block 2402; sealing a package over the cavity of the substrate in a block 2404; and forming an encapsulant over the package and a portion of the substrate substantially preventing the encapsulant from forming in the cavity in a block 2406.

In greater detail, a system to provide the method and apparatus of the integrated circuit package system 100, in an embodiment of the present invention, is performed as follows:

1. Providing a package substrate having a package substrate cavity.
2. Sealing a base package over the package substrate cavity.
3. Applying a package encapsulant over the base package and a portion of the package substrate substantially preventing the package encapsulant from forming in the package substrate cavity.

Thus, it has been discovered that the integrated circuit package system method and apparatus of the present invention furnish important and heretofore unknown and unavailable solutions, capabilities, and functional aspects. The resulting processes and configuration are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:

providing a substrate having a cavity;

sealing a package with a seal, the package having connectors over the cavity of the substrate; and applying an encapsulant over the package with the encapsulant outside a periphery of the seal having the connectors exposed from the encapsulant and partially in the cavity.

2. The method as claimed in claim 1 wherein sealing the package over the cavity of the substrate includes applying a seal material.

3. The method as claimed in claim 1 wherein sealing the package over the cavity of the substrate includes forming the seal with the package and the substrate without the need for a seal material.

4. The method as claimed in claim 1 wherein sealing the package over the cavity of the substrate includes applying a package interconnect between the package and the substrate.

5. The method as claimed in claim 1 further comprising attaching a device partially in the cavity of the substrate.

6. A method for manufacturing an integrated circuit package system comprising;

providing a package substrate having a package substrate cavity;

sealing a base package with a seal, the base package having connectors over the package substrate cavity; and applying a package encapsulant over the base package with the package encapsulant outside a periphery of the seal having the connectors exposed from the package encapsulant and partially in the package substrate cavity.

7. The method as claimed in claim 6 further comprising mounting an electronic device partially in the package substrate cavity.

8. The method as claimed in claim 6 further comprising surface mounting an electronic device partially in the package substrate cavity.

9. The method as claimed in claim 6 further comprising attaching a quad flat no-lead package partially in the package substrate cavity.

10. The method as claimed in claim 6 further comprising attaching a quad flat package or a thin shrink small outline package partially in the package substrate cavity.

11. An integrated circuit package system comprising:

a substrate having a cavity;

a package having connectors sealed with a seal to the substrate over the cavity; and an encapsulant over the package with the encapsulant outside a periphery of the seal having the connectors exposed from the encapsulant and partially in the cavity.

12. The system as claimed in claim 11 wherein the package over the cavity of the substrate includes a seal material.

13. The system as claimed in claim 11 wherein the package over the cavity of the substrate includes the package sealed to the substrate without the need for a seal material.

14. The system as claimed in claim 11 wherein the package over the cavity of the substrate includes a package interconnect between the package and the substrate.

15. The system as claimed in claim 11 further comprising a device partially in the cavity of the substrate.

16. The system as claimed in claim 11 wherein:

the substrate is a package substrate having a package substrate cavity;

the package is a base package sealed to the package substrate over the package substrate cavity; and the encapsulant is a package encapsulant over the base package and a portion of the package substrate having substantially none of the package encapsulant in the package substrate cavity.

17. The system as claimed in claim 16 further comprising an electronic device mounted partially in the package substrate cavity.

18. The system as claimed in claim 16 further comprising an electronic device surface mounted partially in the package substrate cavity.

19. The system as claimed in claim 16 further comprising a quad flat no-lead package partially in the package substrate cavity.

20. The system as claimed in claim 16 further comprising a quad flat package or a thin shrink small outline package partially in the package substrate cavity.

* * * * *

UNITED STATES PATENT AND TRADEMARK OFFICE

CERTIFICATE OF CORRECTION

PATENT NO. : 8,258,614 B2
APPLICATION NO. : 11/938371
DATED : September 4, 2012
INVENTOR(S) : Camacho et al.

It is certified that error appears in the above-identified patent and that said Letters Patent is hereby corrected as shown below:

In the Specification:

Column 4, line 46, delete “encaosulant 102 s” and insert therefor --encapsulant 102 is--

Column 4, line 47, delete “a periphery or the seal” and insert therefor --a periphery of the seal--

Column 5, line 16, delete “ex)osed from the ackaize encapsulant)102” and insert therefor --exposed from the package encapsulant 102--

Signed and Sealed this
Eighteenth Day of March, 2014

Michelle K. Lee
*Deputy Director of the United States Patent and Trademark Office*